(12) United States Patent
Anda

(10) Patent No.: US 7,199,014 B2
(45) Date of Patent: Apr. 3, 2007

(54) FIELD EFFECT TRANSISTOR AND METHOD OF MANUFACTURING THE SAME

(75) Inventor: Yoshiharu Anda, Uozu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 130 days.

(21) Appl. No.: 11/000,239

(22) Filed: Dec. 1, 2004

(65) Prior Publication Data

US 2005/0139868 A1 Jun. 30, 2005

(30) Foreign Application Priority Data

Dec. 24, 2003 (JP) ............... 2003-426630

(51) Int. Cl.
*H01L 21/336* (2006.01)
(52) U.S. Cl. ....................... 438/285; 438/570
(58) Field of Classification Search ........... 438/47, 438/285, 570, 571, 590
See application file for complete search history.

(56) References Cited

U.S. PATENT DOCUMENTS 6,534,790 B2 * 3/2003 Kato et al. ............... 257/76
7,012,286 B2 * 3/2006 Inai et al. ............... 257/192

FOREIGN PATENT DOCUMENTS

JP 945894 2/1997
JP 11150263 6/1999

* cited by examiner

*Primary Examiner*—Hoai Pham
(74) *Attorney, Agent, or Firm*—Stevens, Davis, Miller & Mosher, LLP

(57) ABSTRACT

There is provided a field effect transistor which is suitable for a power amplifier application or the like, and have a double recess structure with superior repeatability. A film thickness of an AlGaAs layer can determine a depth of a second step of a recess uniquely by using the AlGaAs layer and an InGaP layer with a higher etching selection ratio, a double recess structure can be formed with desirable repeatability, and a high withstand voltage device suitable for a power amplifier application or the like is achieved by making both side surfaces of a gate electrode into the AlGaAs layer.

4 Claims, 16 Drawing Sheets

FIELD EFFECT TRANSISTOR AND METHOD OF MANUFACTURING THE SAME

BACKGROUND OF THE INVENTION

1. Field of the Invention

The present invention relates to a field effect transistor using a compound semiconductor, and a method of manufacturing the same.

2. Description of the Prior Art

A field effect transistor using compound semiconductors including GaAs has come to be widely used for a power amplifier, a switch, or the like of wireless communications, especially a cellular phone terminal in recent years. An FET using AlGaAs called PHEMT is commonly used for this GaAs FET (Field Effect Transistor) as a Schottky barrier. When this PHEMT is used in a power amplifier application, due to an increase in a source resistance according to a surface state formed in an AlGaAs layer and a protection film interface beside a gate electrode, and frequency dispersion by charge/discharge of said surface state, sufficient performance cannot be achieved. It is known that this problem will be avoidable by isolating an AlGaAs surface from a channel layer by using a structure called a double recess structure (refer to Japanese Laid-Open Patent Application Publication No. 11-150263). FIG. 16 is a cross-sectional view of an electric field effect type transistor with a conventional double recess structure.

In FIG. 16, there are formed in sequence on a substrate 51 consisting of semi-insulating GaAs: a buffer layer 52 with a thickness of 1 micrometer consisting of undoped GaAs for buffering a lattice mismatch between an epitaxial layer 59 to be grown later, and the substrate 51; a buffer layer 53 consisting of undoped AlGaAs; a channel layer 54 which is consisting of undoped $In_{0.2}Ga_{0.8}As$ with a thickness of 20 nm, and through which a carrier passes; a spacer layer 55 consisting of undoped AlGaAs with a thickness of 5 nm; a carrier supply layer 56 (broken line portion) to which Si being an n-type impurity ion is planar-doped by only 1 atom layer; a Schottky layer 57 consisting of undoped AlGaAs with a thickness of 30 nm; and a cap layer 58 consisting of $n^+$-GaAs with a thickness of 100 nm. Moreover, ohmic electrodes 60 are formed in two areas on the cap layer 58. Herein, a recess is arranged in the Schottky layer 57 consisting of undoped AlGaAs, and a gate electrode 62 is formed so that the recess may be covered. In addition, a device isolation region 61 is formed near the ohmic electrode 60. Moreover, an insulating protective film (not shown) with thin film thickness consisting of SiN or SiO is formed so that exposed surfaces of the gate electrode 62, the Schottky layer 57, and the cap layer 58 may be covered.

The FET with the above conventional double recess structure has a problem as described below.

Although a narrow recess depth of the double recess structure has a correlation with a withstand voltage characteristic between gate-drain electrodes, a second step of the recess structure is made by a single material in a conventional method, so that it will be difficult to control the depth with about several tens of nm, and preferable repeatability will not be obtained. For this reason, a field effect transistor using two types of materials of AlGaAs and InGaP, which have an easy etching control property and have a high selection ratio, is also proposed in Japanese Laid-Open Patent Application Publication No. 9-045894. However, a surface beside the gate electrode is consisting of an InGaP layer in this structure, so that it will be difficult to obtain a sufficient withstand voltage when using in a power amplifier application since a level on the surface of InGaP is few.

SUMMARY OF THE INVENTION

The object of the present invention is to provide a field effect transistor which is suitable for a power amplifier application or the like, and has a double recess structure with superior repeatability, and a method of manufacturing the same.

In order to achieve the object described above, a field effect transistor of a first invention, comprises: a channel layer formed on a semi-insulating substrate, a first semiconductor layer consisting of InGaP which is formed on the channel layer, a second semiconductor layer consisting of AlGaAs which is formed on the first semiconductor layer and has an opening; a cap layer which is formed on the second semiconductor layer and has an opening which includes the opening region of the second semiconductor layer and is a region wider than that; a gate electrode which is formed on the second semiconductor layer inside the opening of the cap layer and embedded into the opening of the second semiconductor layer; and a source electrode and a drain electrode which are formed on the cap layer of both sides of the gate electrode.

According to this configuration, since two types of materials of AlGaAs and InGaP having a higher etching selection ratio are used, a double recess structure with superior uniformity and repeatability can be formed. In addition, since the AlGaAs layers are formed in both side surfaces of the gate electrode, an electric field is buffered by a surface state, thereby making it possible to easily obtain a high withstand voltage suitable for a power FET application.

A method of manufacturing a field effect transistor of a second invention, comprises the steps of: forming a buffer layer on a semi-insulating substrate; forming a channel layer on the buffer layer; forming a first semiconductor layer consisting of InGaP on the channel layer; forming a second semiconductor layer consisting of AlGaAs on the first semiconductor layer; forming a cap layer on the second semiconductor layer; forming a first photoresist pattern having an opening on the cap layer; forming a first opening in the cap layer by removing the cap layer by means of performing a selective dry or wet etching process to the second semiconductor layer using the first photoresist pattern as a mask; forming an opening in the second semiconductor layer by selectively etching the second semiconductor layer to the first semiconductor layer through the first opening of the cap layer; forming on the cap layer a second photoresist pattern having an opening wider than the opening of the first photoresist pattern; forming a second opening in the cap layer by selectively etching only the cap layer using the second photoresist pattern as a mask; and forming a gate electrode which is arranged on the second semiconductor layer inside the second opening of the cap layer, and embeds the opening of the second semiconductor layer.

According to this manufacturing method, a film thickness of the AlGaAs layer can determine a depth of a second step of the recess uniquely by using the AlGaAs layer and the InGaP layer with a higher etching selection ratio, a double recess structure can be formed with desirable repeatability, and a high withstand voltage device can be achieved by making the both side surfaces of the gate electrode into the AlGaAs layer.

A method of manufacturing a field effect transistor of a third invention is characterized in that in the method of manufacturing the field effect transistor of the second invention, the step of forming the opening in the second semiconductor layer includes a step of etching the second semiconductor layer using an aqueous solution including a phosphoric acid and a hydrogen peroxide solution.

A method of manufacturing a field effect transistor of a fourth invention is characterized in that in the method of manufacturing the field effect transistor of the second invention, the step of forming the second opening in the cap layer includes a step of etching the cap layer using an aqueous solution including a citric acid and a hydrogen peroxide solution.

A method of manufacturing a field effect transistor of a fifth invention is characterized in that in the method of manufacturing the field effect transistor of the second invention, the step of forming the second opening in the cap layer includes a step of etching the cap layer using gas including $SiCl_4$ and $SF_6$.

DETAILED DESCRIPTION OF THE PREFERRED EMBODIMENTS

Figure 1:
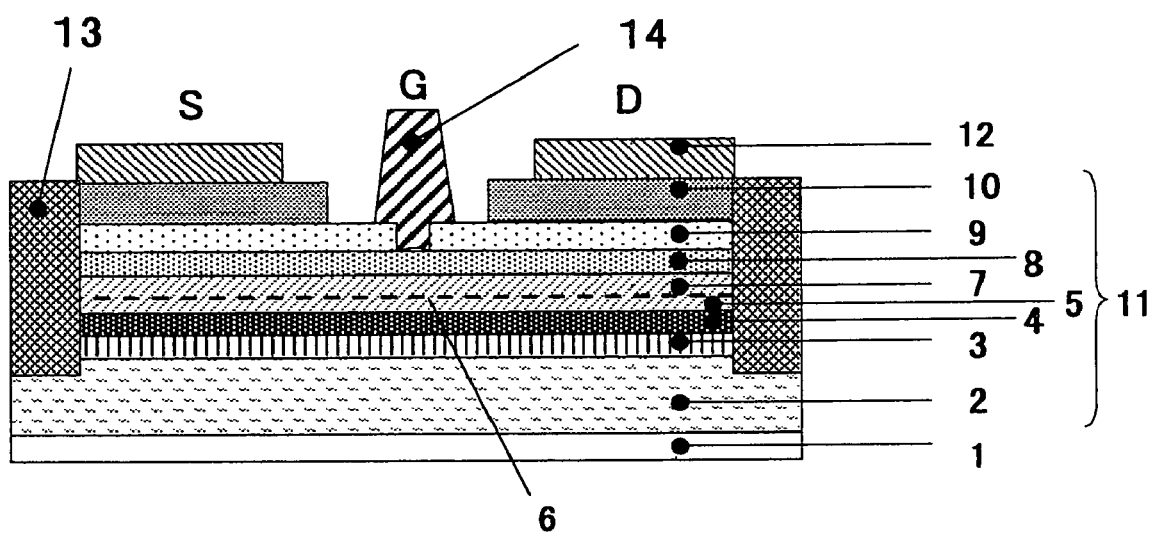
FIG. 1 is a cross-sectional view showing an electric field effect type transistor according to a first embodiment.

Hereafter, referring to the drawings, description will be made of a first embodiment according to the present invention. FIG. 1 shows a cross section configuration of a semiconductor device according to the first embodiment of the present invention.

There are formed in sequence on a substrate 1 consisting of semi-insulating GaAs: a buffer layer 2 with a thickness of 1 micrometer consisting of undoped GaAs for buffering a lattice mismatch between an epitaxial layer 11 to be grown later, and the substrate 1; a buffer layer 3 with a thickness of 100 nm consisting of undoped AlGaAs; a channel layer 4 which is consisting of undoped $In_{0.2}Ga_{0.8}As$ with a thickness of 20 nm, and through which a carrier passes; a spacer layer 5 consisting of undoped $Al_{0.25}Ga_{0.75}As$ with a thickness of 5 nm; a carrier supply layer 6 (broken line portion) to which Si being an n-type impurity ion is planar-doped by only 1 atom layer so that a dose of Si may be $5\times10\,cm^{-2}$; undoped $Al_{0.25}Ga_{0.75}As$ layer 7 with a thickness of 20 nm; an undoped $In_{0.48}Ga_{0.52}P$ layer (first semiconductor layer) 8 with a thickness of 10 nm; undoped $Al_{0.25}Ga_{0.75}As$ layer (second semiconductor layer) 9 with a thickness of 20 nm; and a cap layer 10 consisting of n$^+$-GaAs with a thickness of 100 nm. Moreover, ohmic electrodes 12 are formed in two areas on the cap layer 10, and configure a source electrode (S) and a drain electrode (D). In addition, a part of the AlGaAs layer 9 is selectively removed to the InGaP layer 8, a gate electrode 14 consisting of, for example Mo or the like is formed so as to cover a recess that is a removed portion thereof. In addition, a device isolation region 13 is formed near the ohmic electrode 12. Moreover, an insulating protective film (not shown) with thin film thickness consisting of SiN or SiO is formed so that exposed surfaces of the gate electrode 14, the InGaAs layer 9, and the cap layer 10 may be covered.

Next, referring to the drawings, description will be made of a method of manufacture the semiconductor device configured as described above.

Figure 2:
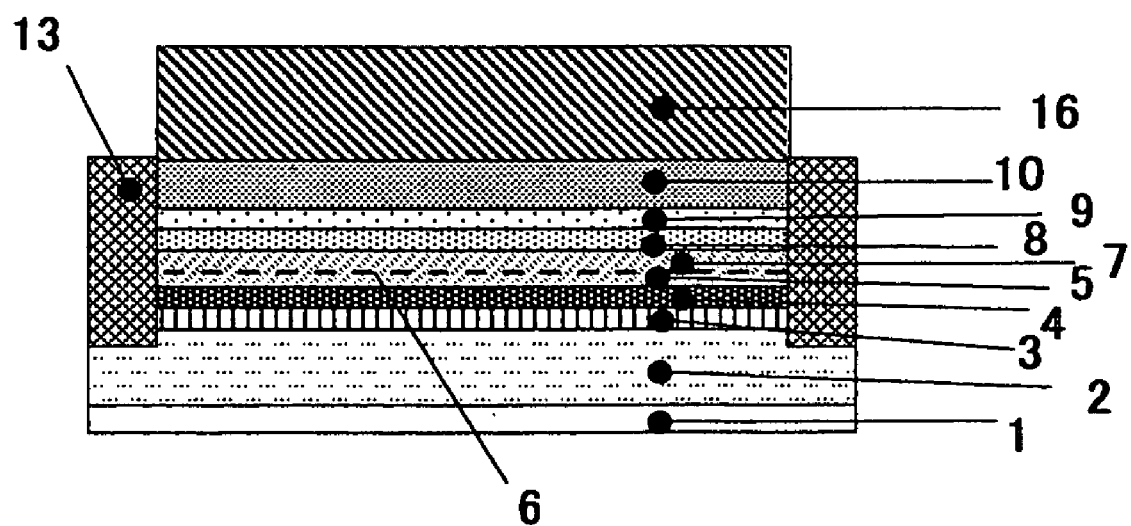
FIG. 2 is a cross-sectional view showing a method of manufacturing the electric field effect type transistor according to the first embodiment.

As shown in FIG. 2, first, the GaAs buffer layer 2, the AlGaAs buffer layer 3, the channel layer 4, the spacer layer 5, the carrier supply layer 6 (broken line portion), the AlGaAs layer 7, the InGaP layer 8, the AlGaAs layer 9 used as a Schottky layer, and the cap layer 10 consisting of GaAs are epitaxially grown in sequence on the substrate 1 consisting of semi-insulating GaAs using MO-CVD method, MBE method, or the like. Herein, a whole from the buffer layer 2 to the cap layer 10 which are epitaxially grown will be called as an epitaxial layer 11.

Next, a pattern is formed in a predetermined location with a photoresist 16, a desired location is protected, and ion implantation is performed, so that a device isolation region 13 is formed. Incidentally, the device isolation can also be achieved by mesa-etching a predetermined location of the epitaxial layer 11.

Figure 3:
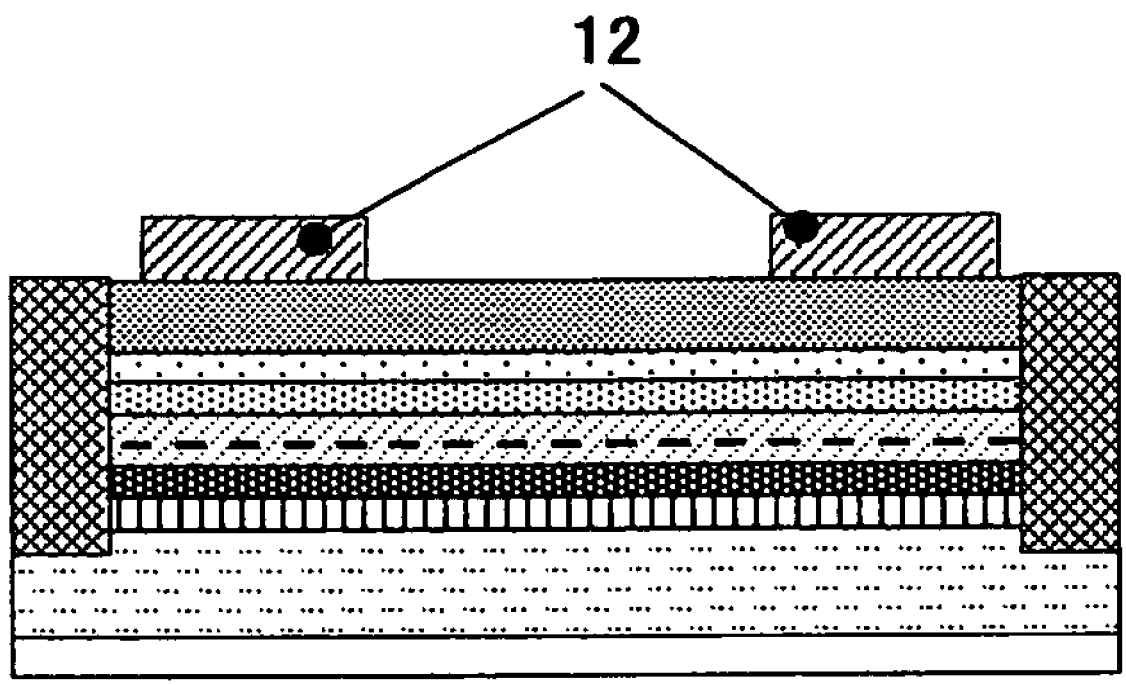
FIG. 3 is a cross-sectional view showing the method of manufacturing the electric field effect type transistor according to the first embodiment.

Next, a photoresist pattern is formed after removing the photoresist 16, and an ohmic metal consisting of a Ni/Au/Ge alloy is evaporated on a whole surface thereof (not shown) to perform a lift-off process, so that the ohmic electrode 12 is formed as shown in FIG. 3.

Figure 4:
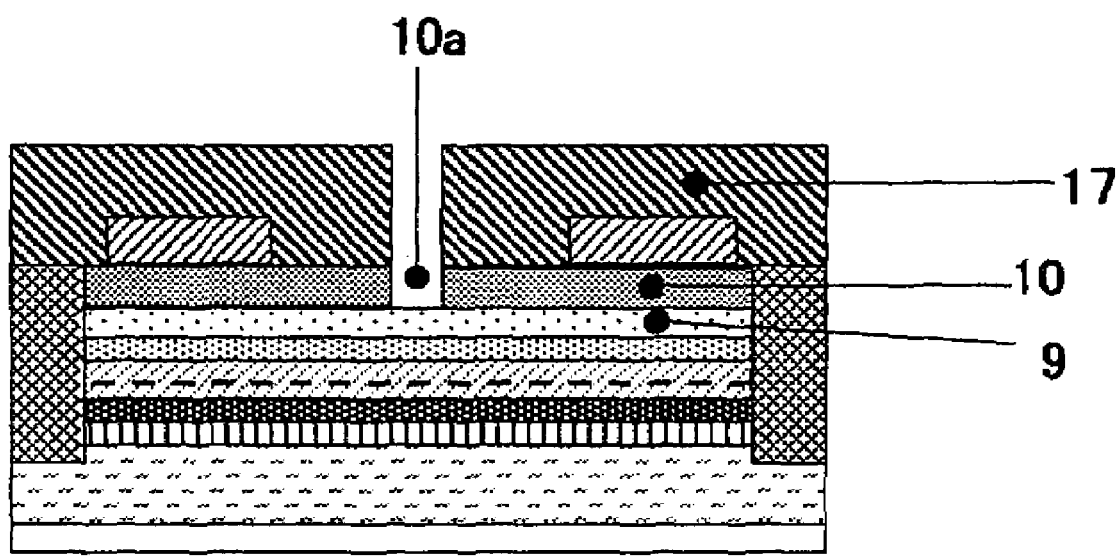
FIG. 4 is a cross-sectional view showing the method of manufacturing the electric field effect type transistor according to the first embodiment.

Next, after forming a photoresist 17 as shown in FIG. 4, a first recess etching is performed to a predetermined location between the ohmic electrodes of the cap layer 10, so that an opening 10a is obtained. An etching selection ratio between the GaAs cap layer 10 and the AlGaAs layer 9 is increased by using a mixed-solution of, for example a citric acid, a hydrogen peroxide solution, and water in this first recess etching; Thereby, making it possible to selectively remove the cap layer 10 portion, and perform stable recess etching. Alternatively, since the GaAs cap layer 10 can be removed anisotropically and selectively to the AlGaAs layer 9 with mixing gas of $SiCl_4$, $SF_6$, and N2, it is possible to form the opening 10a with a microscopic pattern also by this method.

Figure 5:
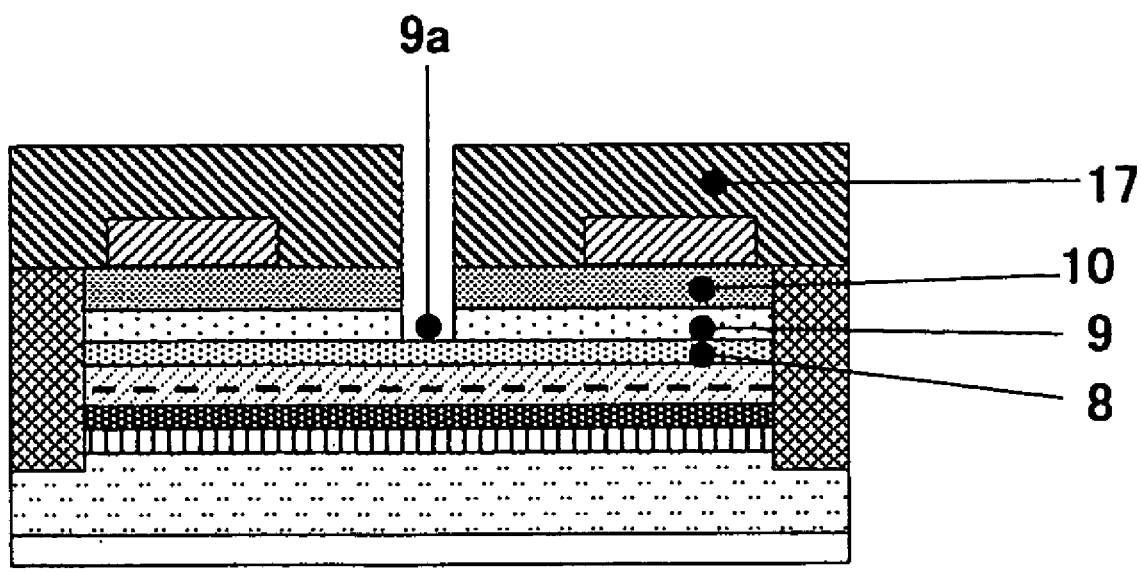
FIG. 5 is a cross-sectional view showing the method of manufacturing the electric field effect type transistor according to the first embodiment.

Moreover, as shown in FIG. 5, an etching selection ratio between the AlGaAs layer 9 and the InGaP layer 8 is increased by using a mixed-solution of, for example a phosphoric acid, a hydrogen peroxide solution, and water to the opening 10a. Thereby making it possible to selectively remove an AlGaAs layer portion 9a.

Figure 6:
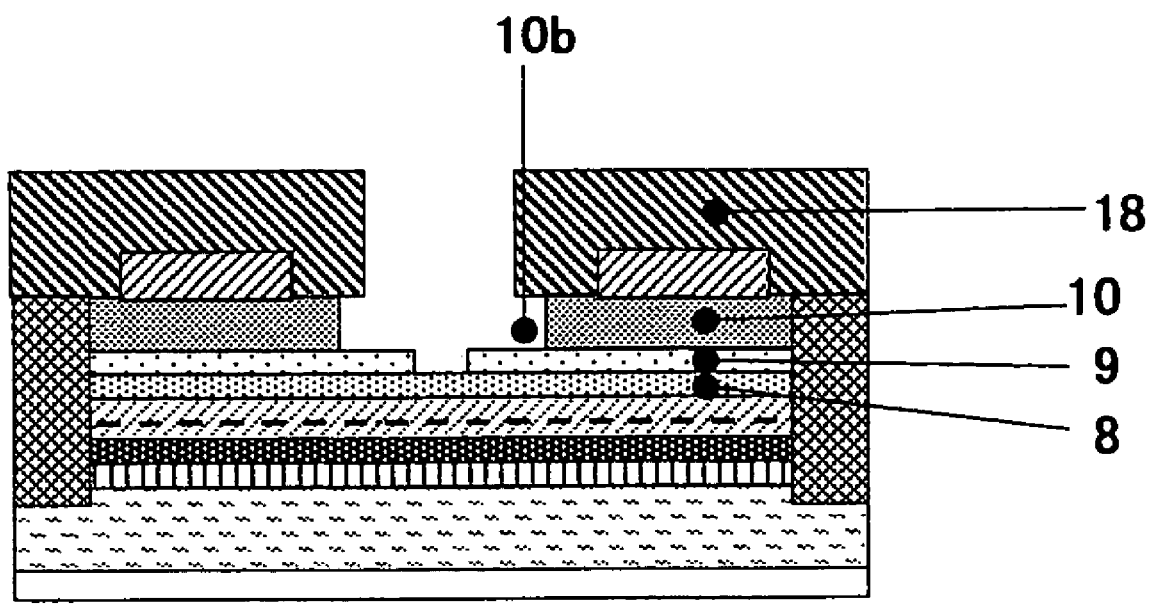
FIG. 6 is a cross-sectional view showing the method of manufacturing the electric field effect type transistor according to the first embodiment.

Next, the photoresist 17 is removed, and a second recess etching is then performed to a predetermined location between the ohmic electrodes of the cap layer 10 after forming a photoresist 18 as shown in FIG. 6, so that an opening 10b as shown in FIG. 6 is thereby obtained. An etching selection ratio between the GaAs cap layer 10, the AlGaAs layer 9, and the InGaP layer 8 is increased by using a mixed-solution of, for example a citric acid, a hydrogen peroxide solution, and water in this second recess etching. Thereby making it possible to selectively remove the cap layer portion 10b and perform stable recess etching. In addition, for this second recess etching, it is possible to perform a selective dry etching of the GaAs cap layer 10 to the AlGaAs layer 9 and the InGaP layer 8 with mixing gas of $SiCl_4$ and $SF_6$.

Figure 7:
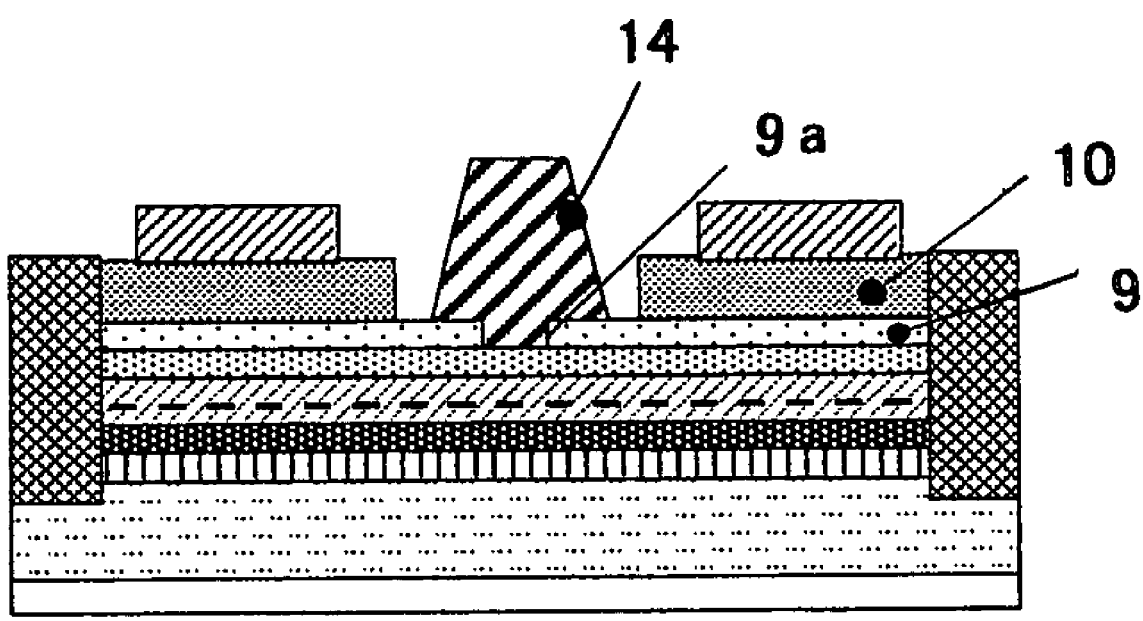
FIG. 7 is a cross-sectional view showing the method of manufacturing the electric field effect type transistor according to the first embodiment.

Next, as shown in FIG. 7, a high melting point metal, for example Mo/Pt/Au in which Mo is the lowest layer is evaporated on a whole surface to perform lift-off process, so that the gate electrode 14 is formed so as to cover the AlGaAs removed portion 9a. Subsequently, an insulating protective film (not shown) with thin thickness consisting of SiN or SiO is formed so that exposed surfaces of the gate electrode 14, the AlGaAs layer 9, and the cap layer 10 may be covered.

According to this embodiment as described above, a film thickness of the AlGaAs layer can determine the depth of the second step of the recess uniquely by using the AlGaAs layer 9 and the InGaP layer 8 with a higher etching selection ratio, a double recess structure can be formed with desirable repeatability, and a high withstand voltage device suitable for a power amplifier application or the like is achieved by making the both side surfaces of the gate electrode into the AlGaAs layer 9.

Figure 8:
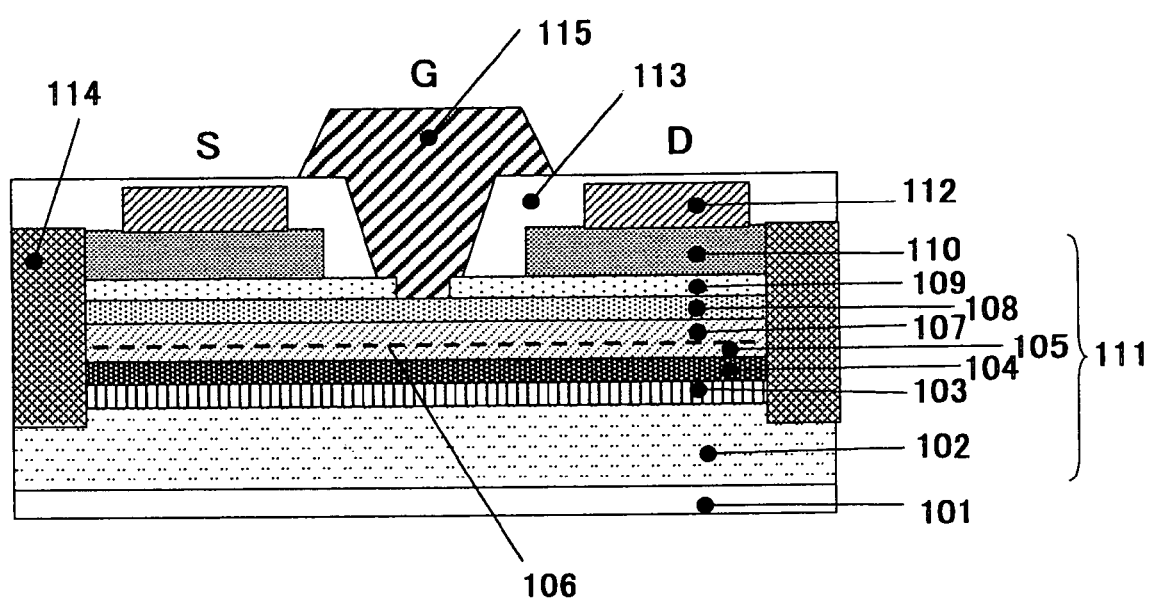
FIG. 8 is a cross-sectional view showing an electric field effect type transistor according to a second embodiment.

Hereafter, referring to the drawings, description will be made of a second embodiment according to the present invention. FIG. 8 shows a cross section configuration of a semiconductor device according to the second embodiment of the present invention.

There are formed in sequence on a substrate 101 consisting of semi-insulating GaAs: a buffer layer 102 with a thickness of 1 micrometer consisting of undoped GaAs for buffering a lattice mismatch between an epitaxial layer to be grown later, and the substrate 101; a buffer layer 103 with a thickness of 100 nm consisting of undoped AlGaAs; a channel layer 104 which is consisting of undoped $In_{0.02}Ga_{0.08}As$ with a thickness of 20 nm, and through which a carrier passes; a spacer layer 105 consisting of undoped $Al_{0.25}Ga_{0.75}As$ with a thickness of 5 nm; a carrier supply layer 106 (broken line portion) to which Si being an n-type impurity ion is planar-doped by only 1 atom layer so that a dose of Si may be $5 \times 10^{12}$ $cm^{-2}$; an undoped $Al_{0.25}Ga_{0.75}As$ layer 107 with a thickness of 20 nm; an undoped $In_{0.48}Ga_{0.52}P$ layer (first semiconductor layer) 108 with a thickness of 10 nm; an undoped $Al_{0.25}Ga_{0.75}As$ layer (second semiconductor layer) 109 with a thickness of 20 nm; and a cap layer 110 consisting of $n^+$-GaAs with a thickness of 100 nm. Moreover, ohmic electrodes 12 are formed in two areas on the cap layer 110, and configure a source electrode (S) and a drain electrode (D). In addition, in order to protect the AlGaAs layer 109, an insulation film 113 is formed. In addition, a part of the AlGaAs layer 109 is selectively removed to the InGaP layer 108, a gate electrode 115 consisting of, for example WSi or the like is formed so as to cover a recess that is a removed portion and stand on the insulation film 113. In addition, a device isolation region 114 is formed near the ohmic electrode 112. Moreover, an insulating protective film (not shown) with thin film thickness consisting of SiN or SiO is formed so that an exposed surface of the gate electrode 115 may be covered.

Next, referring to the drawings, description will be made of a method of manufacture the semiconductor device configured as described above.

Figure 9:
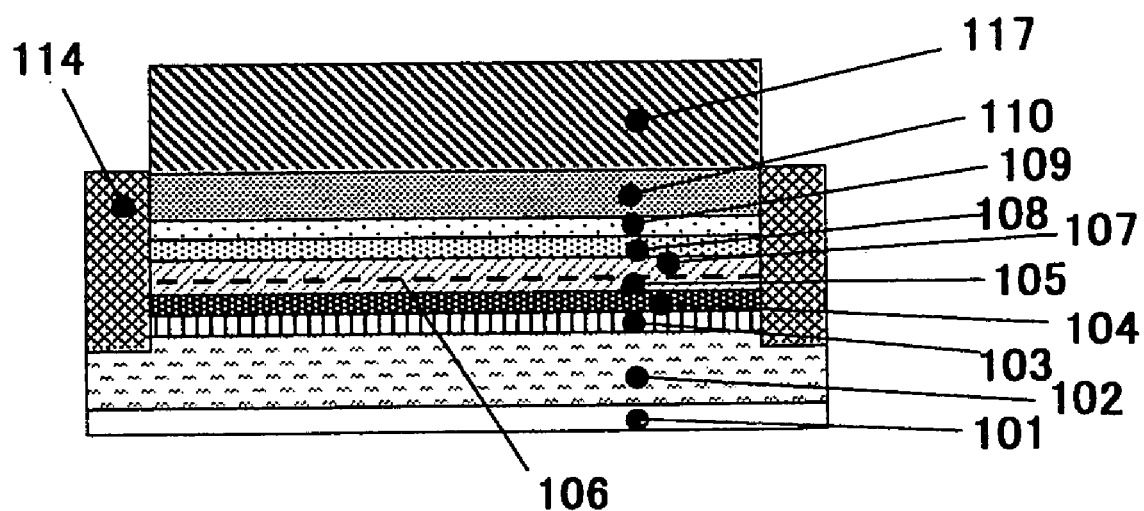
FIG. 9 is a cross-sectional view showing a method of manufacturing the electric field effect type transistor according to the second embodiment.

At first, as shown in FIG. 9, the GaAs buffer layer 102, the AlGaAs buffer layer 103, the channel layer 104, the spacer layer 105, the carrier supply layer 106 (broken line portion), the AlGaAs layer 107, the InGaP layer 108, the AlGaAs layer 109 used as a Schottky layer, the cap layer 110 consisting of GaAs are epitaxially grown in sequence on the substrate 101 consisting of semi-insulating GaAs using MO-CVD method, MBE method, or the like. Herein, a whole from the buffer layer 102 to the cap layer 110 which are epitaxially grown will be called as an epitaxial layer 111.

Next, a pattern is formed in a predetermined location with a photoresist 117, a desired location is protected, and ion implantation is performed, so that a device isolation region 13 is formed. Incidentally, the device isolation can be also achieved by mesa-etching a predetermined location of the epitaxial layer 111.

Figure 10:
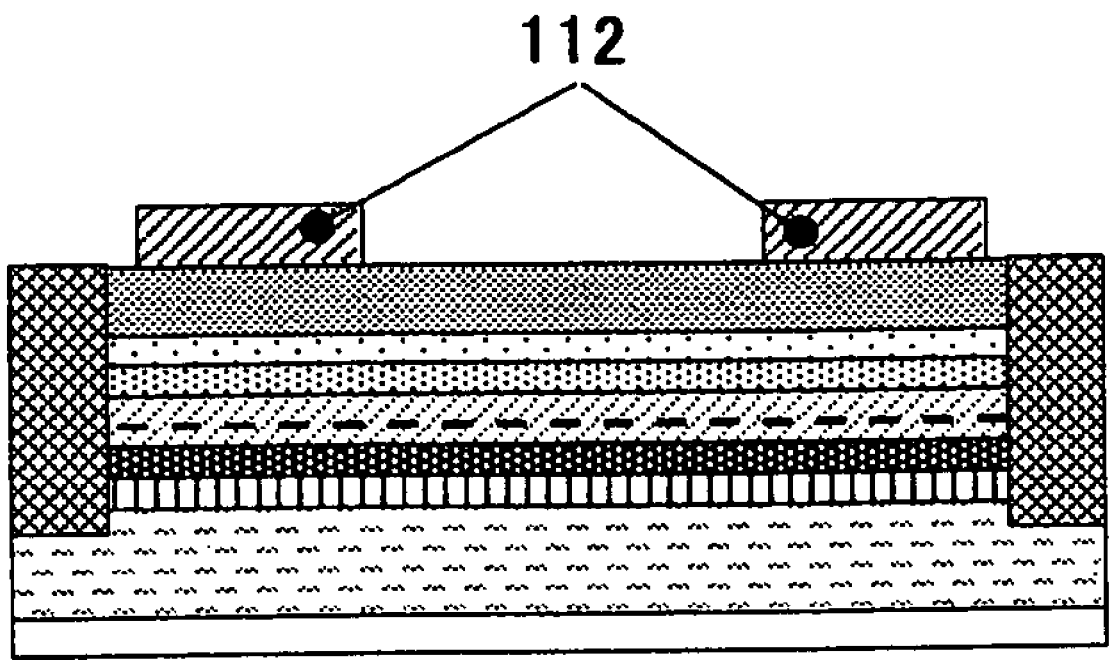
FIG. 10 is a cross-sectional view showing the method of manufacturing the electric field effect type transistor according to the second embodiment.

Next, a photoresist pattern is formed after removing the photoresist 117, and an ohmic metal consisting of a Ni/Au/Ge alloy is evaporated on a whole surface thereof (not shown) to perform a lift-off process, so that the ohmic electrode 112 is formed as shown in FIG. 10.

Figure 11:
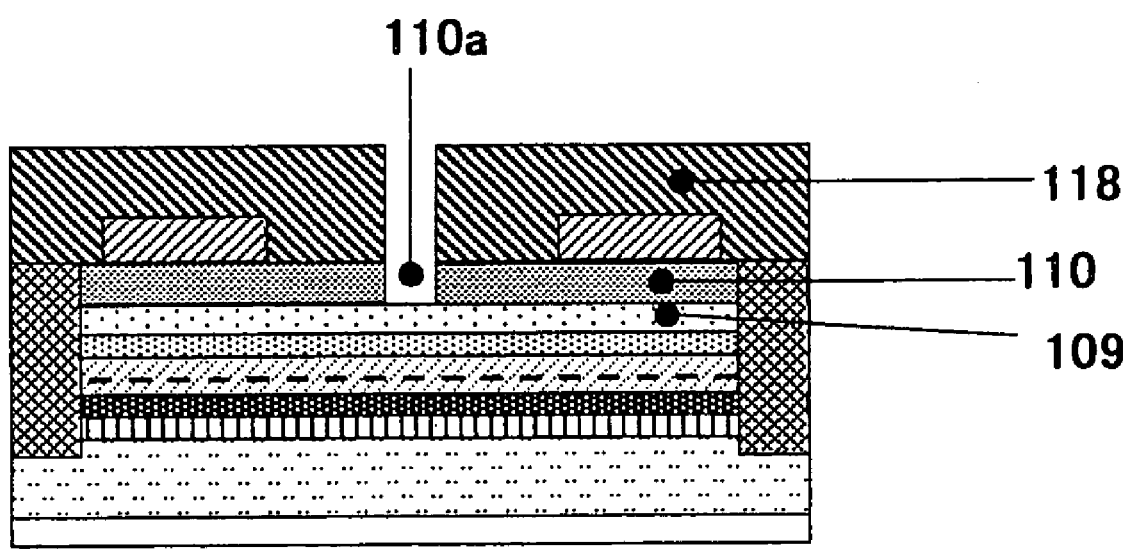
FIG. 11 is a cross-sectional view showing the method of manufacturing the electric field effect type transistor according to the second embodiment.

Next, after forming a photoresist 118 as shown in FIG. 11, a first recess etching is performed to a predetermined location between the ohmic electrodes of the cap layer 110, so that an opening 110a is obtained. An etching selection ratio between the GaAs cap layer 110 and the AlGaAs layer 109 is increased by using a mixed-solution of, for example a citric acid, a hydrogen peroxide solution, and water in this first recess etching. Thereby making it possible to selectively remove the cap layer 110 portion, and perform stable recess etching. Alternatively, since the GaAs cap layer 110 can be removed anisotropically and selectively to the AlGaAs layer 109 with mixing gas of $SiCl_4$, $SF_6$, and $N_2$, it is possible to form the opening 110a with a microscopic pattern also by this method.

Figure 12:
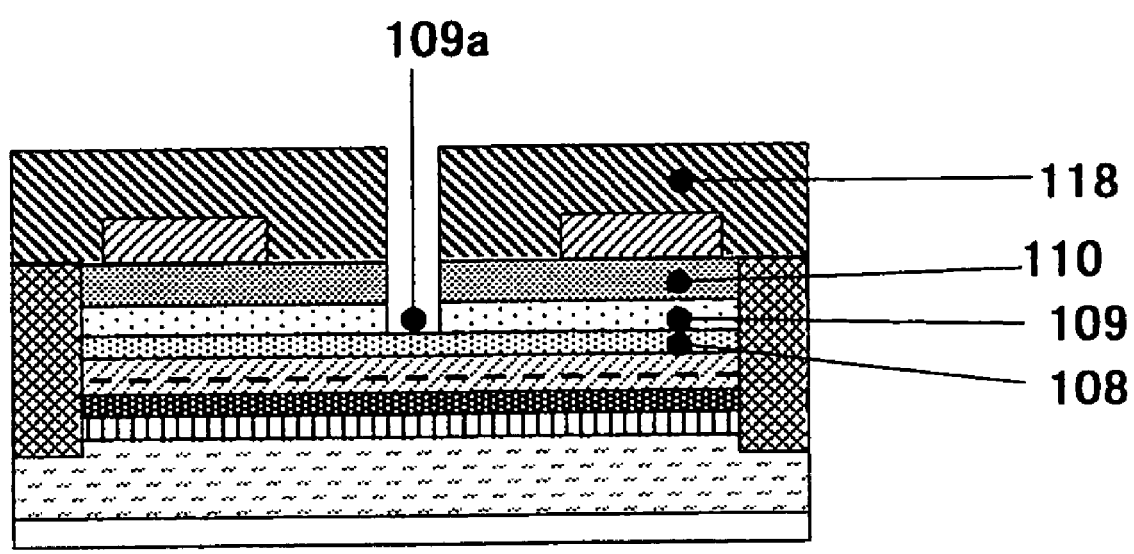
FIG. 12 is a cross-sectional view showing the method of manufacturing the electric field effect type transistor according to the second embodiment.

Moreover, as shown in FIG. 12, an etching selection ratio between the AlGaAs layer 109 and the InGaP layer 108 is increased by using a mixed-solution of, for example a phosphoric acid, a hydrogen peroxide solution, and water to the opening 110a. Thereby making it possible to selectively remove an AlGaAs layer portion 109a.

Figure 13:
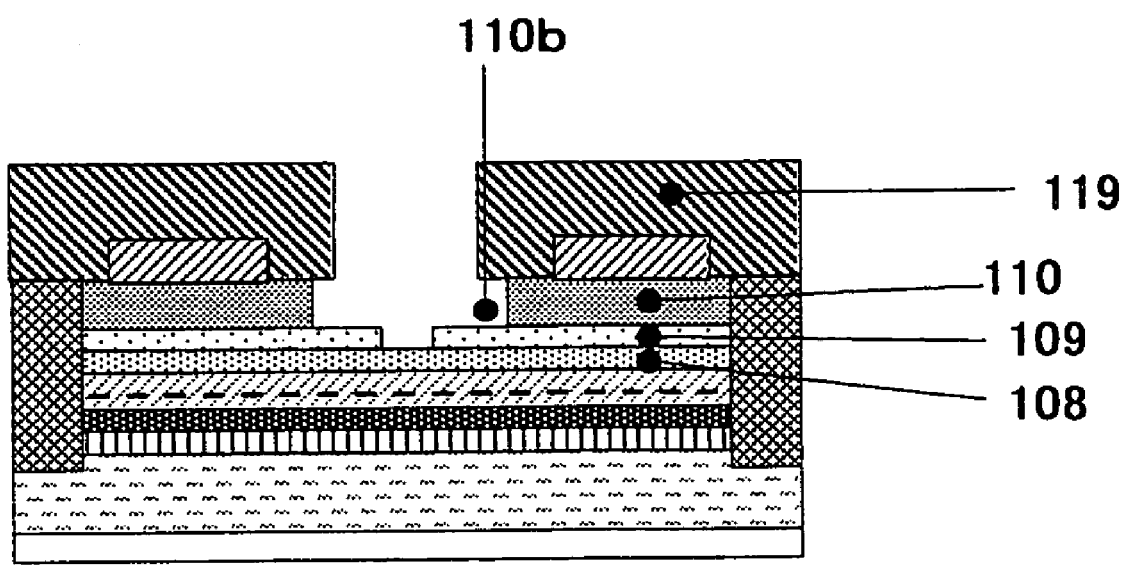
FIG. 13 is a cross-sectional view showing the method of manufacturing the electric field effect type transistor according to the second embodiment.

Next, the photoresist 17 is removed, and a second recess etching is then performed to a predetermined location between the ohmic electrodes of the cap layer 110 after forming a photoresist 119 as shown in FIG. 13, so that an opening 110b as shown in FIG. 13 is thereby obtained. An etching selection ratio between the GaAs cap layer 110, the AlGaAs layer 109, and the InGaP layer 108 is increased by using a mixed-solution of, for example a citric acid, a hydrogen peroxide solution, and water in this second recess etching. Thereby making it possible to selectively remove the cap layer portion 110b, and perform stable recess etching. In addition, for this second recess etching, it is possible to perform a selective dry etching of the GaAs cap layer 110 to the AlGaAs layer 109 and the InGaP layer 108 with mixing gas of $SiCl_4$ and $SF_6$.

Figure 14:
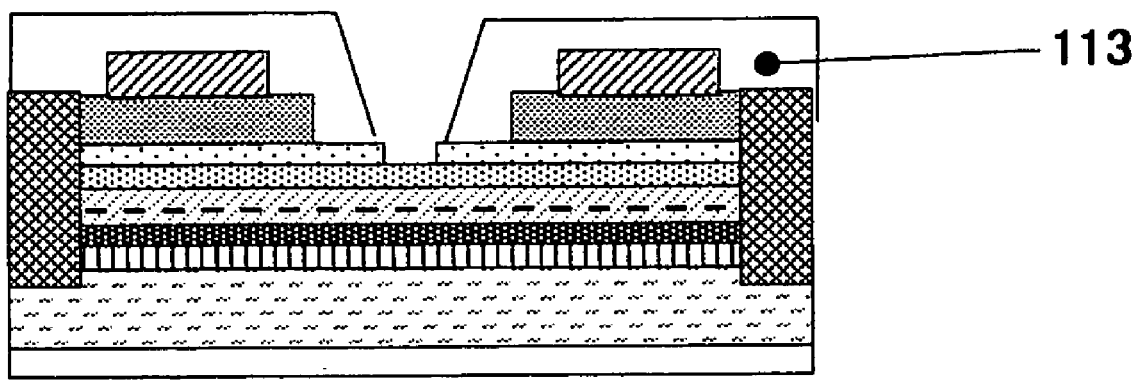
FIG. 14 is a cross-sectional view showing the method of manufacturing the electric field effect type transistor according to the second embodiment.

Next, as shown in FIG. 14, an insulation film 113 consisting of SiN or SiO is formed so as to cover the recess portion. Moreover, a part of the insulation film 113 of a gate electrode formation region is removed by low damage dry etching.

Figure 15:
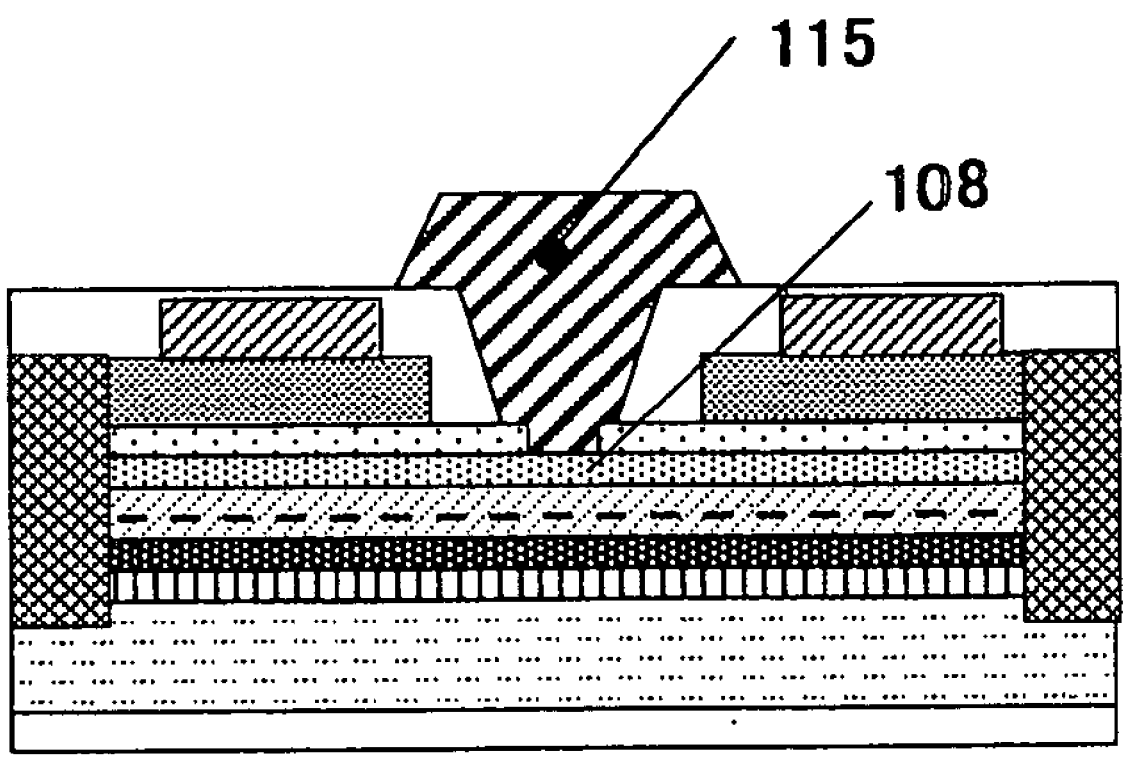
FIG. 15 is a cross-sectional view showing the method of manufacturing the electric field effect type transistor according to the second embodiment.
Figure 16:
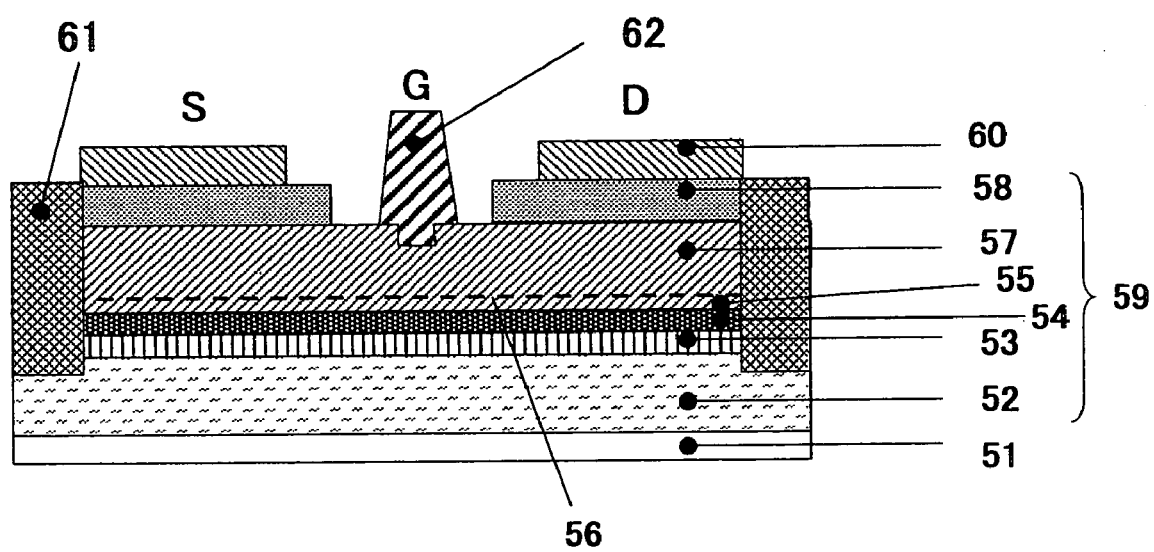
FIG. 16 is a cross-sectional view showing a conventional electric field effect type transistor.

Next, as shown in FIG. 15, a gate electrode film with a stacked layer structure of WSi/Ti/Pt/Au is formed by a sputtering method so that a high melting point metal, for example WSi or the like may be in the lowest layer. Thus, by using the high melting point metal such as WSi or the like for the gate electrode film, interdiffusion with the InGaP layer 108 can be suppressed, thereby making it possible to obtain a thermally stable FET. Moreover, a gate pattern is formed with the photoresist, an unnecessary metal film is removed using Ar ion milling, and the gate electrode 115 is formed as shown in FIG. 15. Subsequently, the insulating protective film (not shown) with thin film thickness consisting of SiN or SiO is formed so that the exposed surface of the gate electrode 115 may be covered.

According to this embodiment as described above, in a manner similar to the first embodiment, a film thickness of the AlGaAs layer 109 can determine the depth of the second step of the recess uniquely by using the AlGaAs layer 109 and the InGaP layer 108 with a higher etching selection ratio, a double recess structure can be formed with desirable repeatability, and a high withstand voltage device suitable for a power amplifier application or the like is achieved by making the both side surfaces of the gate electrode into the AlGaAs layer 109.

What is claimed is:

1. A method of manufacturing a field effect transistor, comprising the steps of:
    forming a buffer layer on a semi-insulating substrate;
    forming a channel layer on said buffer layer;
    forming a first semiconductor layer consisting of InGaP on said channel layer;
    forming a second semiconductor layer consisting of AlGaAs on said first semiconductor layer;
    forming a cap layer on the second semiconductor layer;
    forming a first photoresist pattern having an opening on said cap layer;
    forming a first opening in said cap layer by removing said cap layer by means of performing a selective dry or wet etching process to said second semiconductor layer using said first photoresist pattern as a mask;
    forming an opening in said second semiconductor layer by selectively etching said second semiconductor layer to said first semiconductor layer through the first opening of said cap layer;
    forming on said cap layer a second photoresist pattern having an opening wider than the opening of said first photoresist pattern;
    forming a second opening in said cap layer by selectively etching only said cap layer using said second photoresist pattern as a mask; and
    forming a gate electrode which is arranged on said second semiconductor layer inside the second opening of said cap layer, and embeds the opening of said second semiconductor layer.

2. A method of manufacturing a field effect transistor according to claim 1, wherein the step of forming the opening in said second semiconductor layer includes a step of etching said second semiconductor layer using an aqueous solution including a phosphoric acid and a hydrogen peroxide solution.

3. A method of manufacturing a field effect transistor according to claim 1, wherein the step of forming the second opening in said cap layer includes a step of etching said cap layer using an aqueous solution including a citric acid and a hydrogen peroxide solution.

4. A method of manufacturing a field effect transistor according to claim 1, wherein the step of forming the second opening in said cap layer includes a step of etching said cap layer using gas including $SiCl_4$ and $SF_6$.

* * * * *